United States Patent
Tark et al.

(10) Patent No.: US 11,935,980 B2
(45) Date of Patent: Mar. 19, 2024

(54) FILTERING PANEL AND PHOTOVOLTAIC MODULE INCLUDING SAME

(71) Applicants: POSCO, Pohang-si (KR); RESEARCH INSTITUTE OF INDUSTRIAL SCIENCE & TECHNOLOGY, Pohang-si (KR)

(72) Inventors: Sung-Ju Tark, Pohang-si (KR); Kun-Hoon Baek, Seoul (KR); Jun-Hong Kim, Seoul (KR); Youn-Joung Choi, Seoul (KR); Ji-Sang Park, Seoul (KR)

(73) Assignees: POSCO CO., LTD, Pohang-si (KR); RESEARCH INSTITUTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 396 days.

(21) Appl. No.: 17/294,588

(22) PCT Filed: Nov. 27, 2019

(86) PCT No.: PCT/KR2019/016458
§ 371 (c)(1),
(2) Date: May 17, 2021

(87) PCT Pub. No.: WO2020/111769
PCT Pub. Date: Jun. 4, 2020

(65) Prior Publication Data
US 2022/0005963 A1    Jan. 6, 2022

(30) Foreign Application Priority Data
Nov. 29, 2018   (KR) .......................... 10-2018-0151460

(51) Int. Cl.
*H01L 31/054*   (2014.01)
*G02B 5/20*   (2006.01)

(52) U.S. Cl.
CPC .......... *H01L 31/0543* (2014.12); *G02B 5/208* (2013.01)

(58) Field of Classification Search
CPC ........................... H01L 31/0543; G02B 5/208
See application file for complete search history.

(56) References Cited

U.S. PATENT DOCUMENTS

2009/0288705 A1   11/2009  Hiwatashi et al.
2010/0212717 A1    8/2010  Whitlock et al.
(Continued)

FOREIGN PATENT DOCUMENTS

JP   2010-234741 A   10/2010
JP   2015-028515 A    2/2015
(Continued)

OTHER PUBLICATIONS

International Search Report dated Apr. 24, 2020 issued in International Patent Application No. PCT/KR2019/016458 (with English translation).
(Continued)

*Primary Examiner* — Jayne L Mershon
(74) *Attorney, Agent, or Firm* — Morgan, Lewis & Bockius LLP

(57) ABSTRACT

A filtering panel includes a molding layer part; a pattern layer part having an incident surface through which light emitted from a light source and viewing light transmitted to an observer enter, and an accommodation surface which is the reverse surface of the incident surface, wherein the molding layer part is stacked on the incident surface so as to be adjacent thereto, and the pattern layer part adjusts the optical paths of the emitted light and the viewing light; and a filtering layer part formed on a lower incident surface of the pattern layer part having the incident surface of the viewing light that enters from a lower region below a
(Continued)

(a)

(b)

horizontal reference line, wherein the reflectivity of the visible light in the viewing light incident on the lower region is made greater than that of an upper region above the reference line by means of mirror reflection.

9 Claims, 10 Drawing Sheets

(56) References Cited

U.S. PATENT DOCUMENTS

| | | | |
|---|---|---|---|
| 2011/0222145 A1* | 9/2011 | Ito | G02B 5/208 |
| | | | 359/359 |
| 2018/0130921 A1* | 5/2018 | Mayer | H01L 31/02168 |
| 2018/0364095 A1* | 12/2018 | Nagaya | G02B 1/04 |
| 2020/0161491 A1 | 5/2020 | Kim et al. | |

FOREIGN PATENT DOCUMENTS

| | | | |
|---|---|---|---|
| JP | 2017-046496 A | | 3/2017 |
| JP | 2017046496 | * | 3/2017 |
| JP | 2017-184576 A | | 10/2017 |
| JP | 2017184576 | * | 10/2017 |
| JP | S63-031476 B2 | | 5/2018 |
| KR | 10-2009-0085941 A | | 8/2009 |
| KR | 10-2009-0101226 A | | 9/2009 |
| KR | 10-2010-0044757 A | | 4/2010 |
| KR | 10-2012-0073895 A | | 7/2012 |
| KR | 10-2013-0109929 A | | 10/2013 |
| KR | 10-1803496 B1 | | 11/2017 |
| KR | 10-1917533 B1 | | 11/2018 |
| KR | 10-1940921 B1 | | 1/2019 |
| KR | 10-2020-0036528 A | | 4/2020 |
| KR | 10-2020-0050540 A | | 5/2020 |
| WO | 2011/124764 A1 | | 10/2011 |

OTHER PUBLICATIONS

Extended European Search Report dated Dec. 8, 2021 issued in European Patent Application No. 19888965.1.

* cited by examiner

[FIG. 1]
(a)
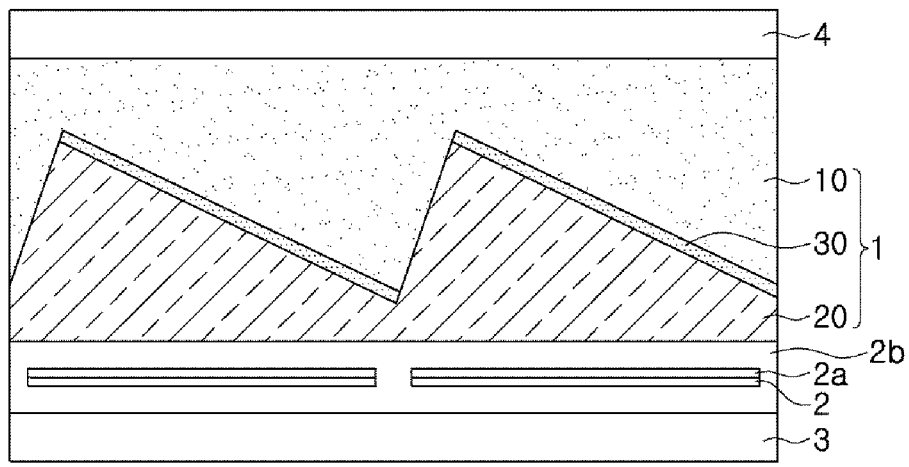
(b)
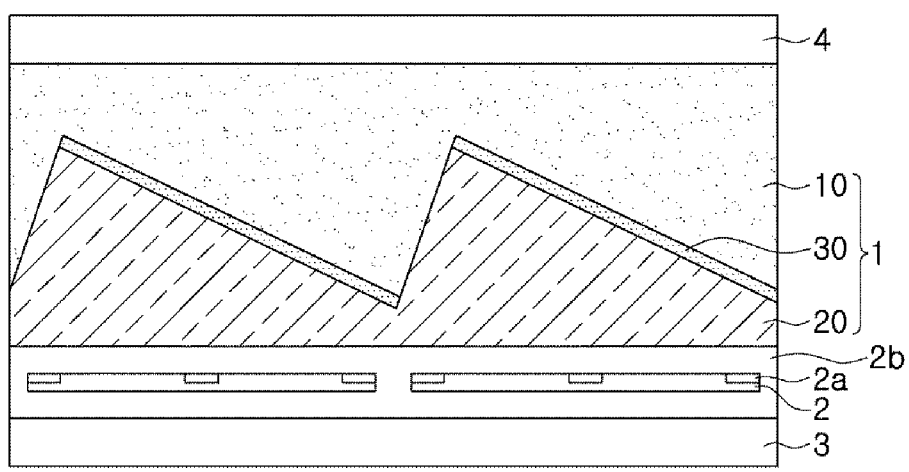

[FIG. 2]
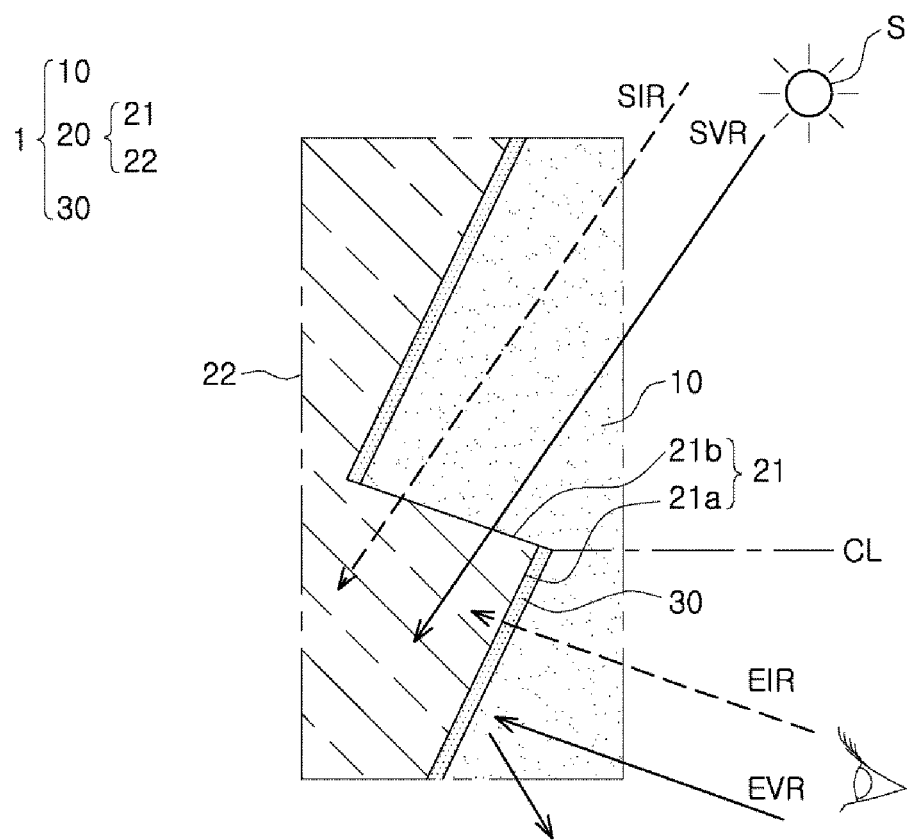

[FIG. 3]
(a)
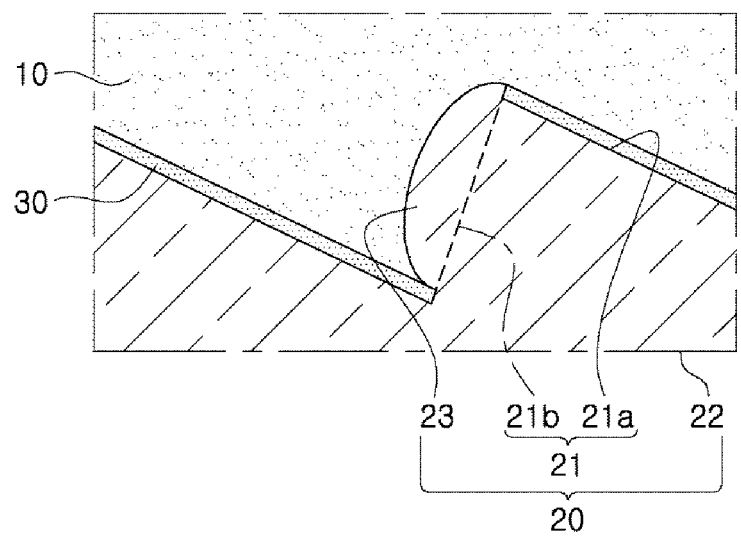
(b)
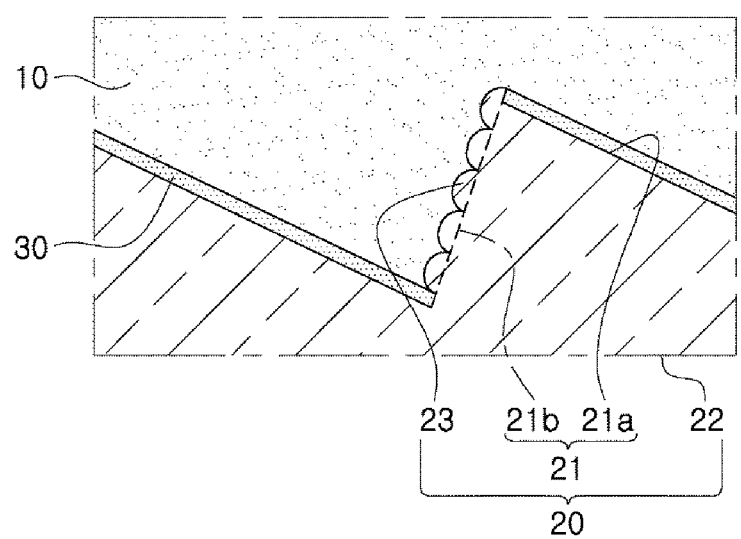

[FIG. 4]
(a) 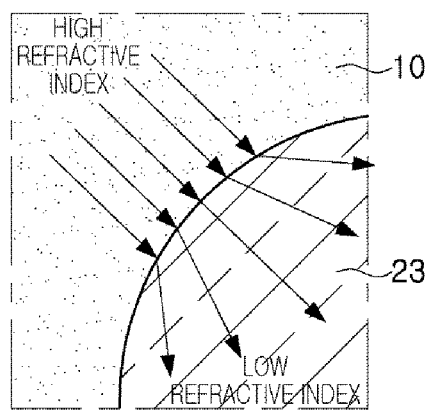 (b) 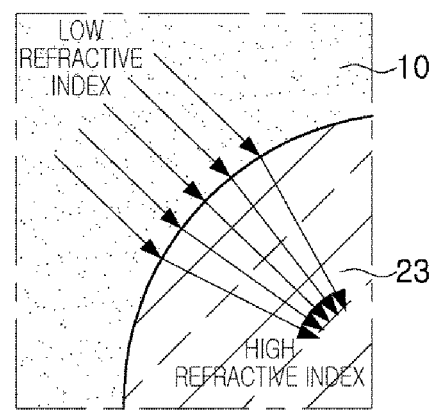

[FIG. 5]
(a)
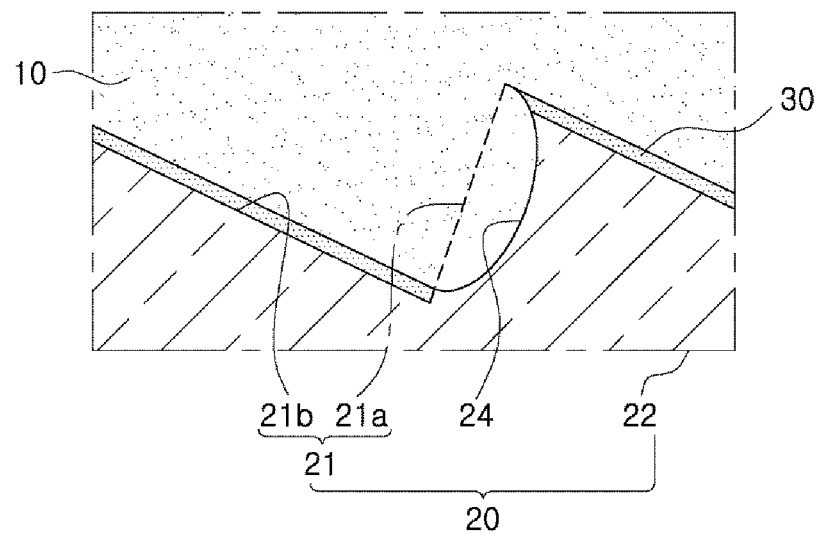
(b)
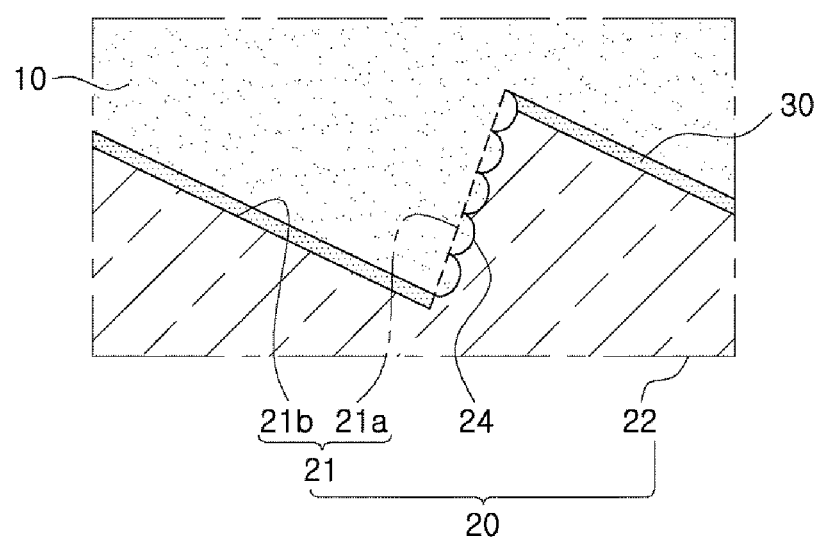

[FIG. 6]
(a) 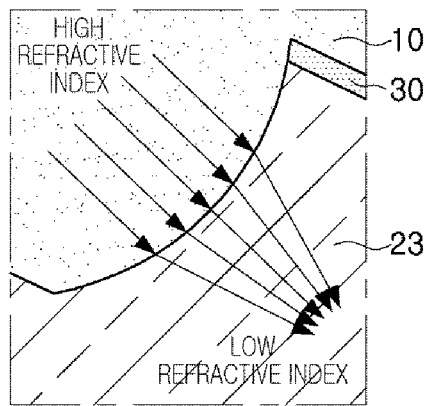
(b) 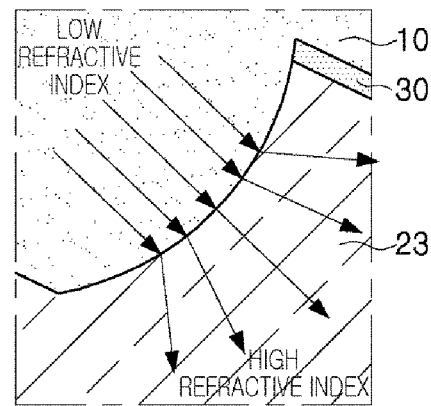

[FIG. 7]
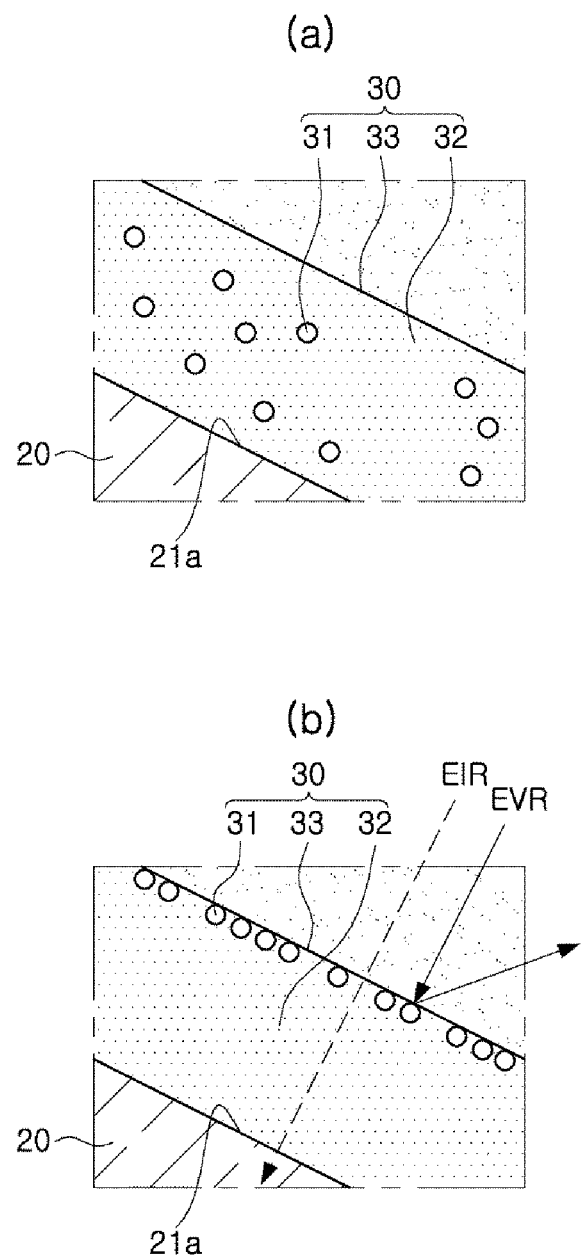

[FIG. 8]
(a)
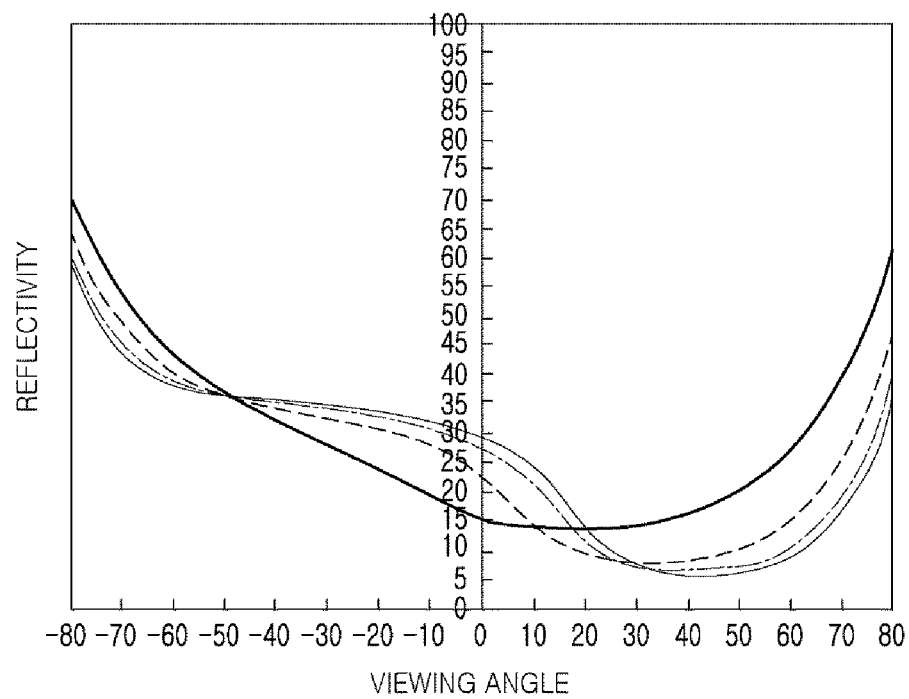
(b)
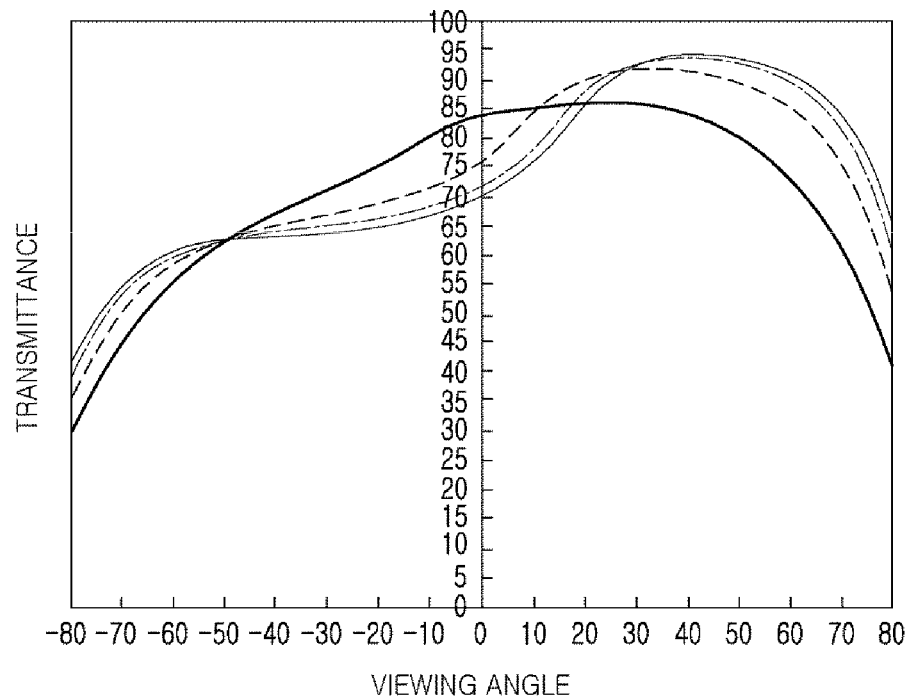

[FIG. 9]
(a) 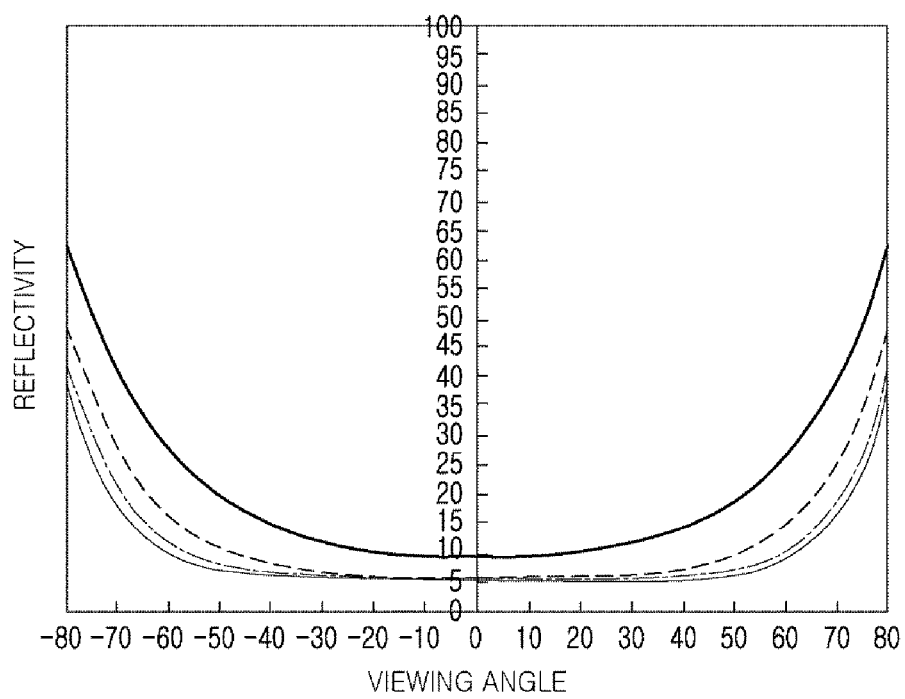
(b) 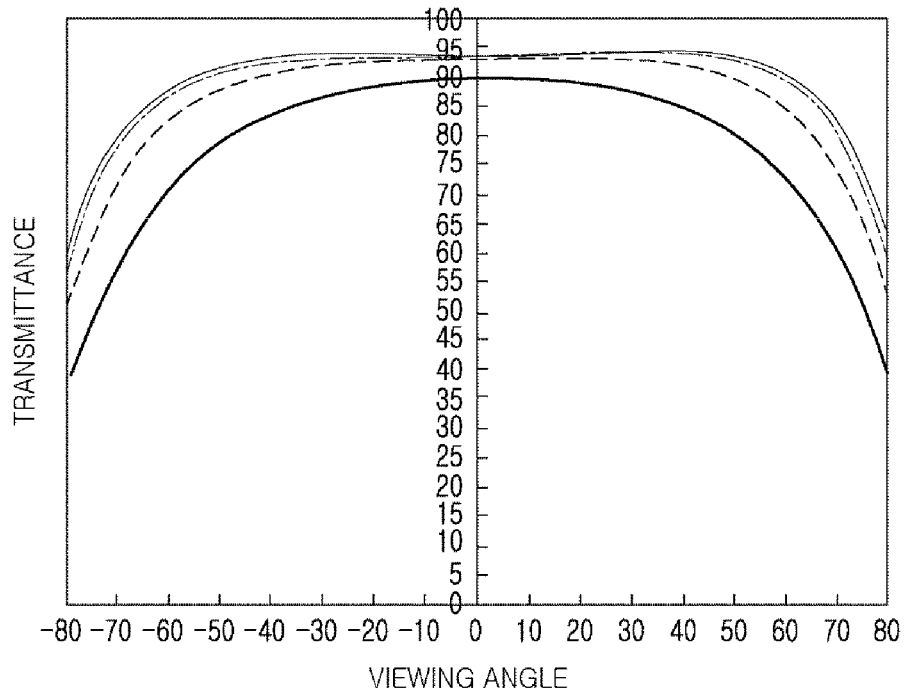

[FIG. 10]
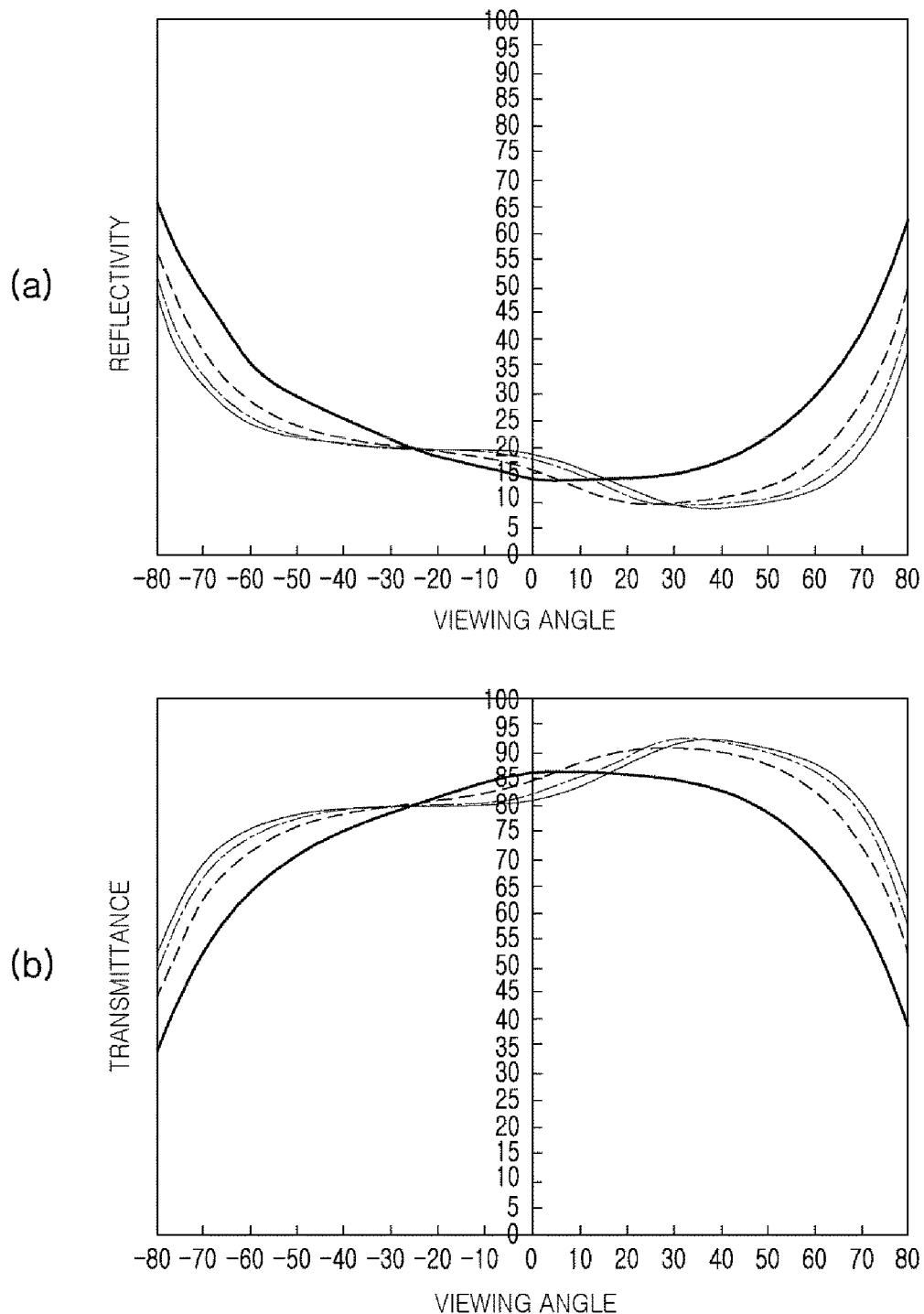

FILTERING PANEL AND PHOTOVOLTAIC MODULE INCLUDING SAME

CROSS-REFERENCE OF RELATED APPLICATIONS

This application is the U.S. National Phase under 35 U.S.C. § 371 of International Patent Application No. PCT/KR2019/016458, filed on Nov. 27, 2019, which in turn claims the benefit of Korean Application No. 10-2018-0151460, filed on Nov. 29, 2018, the entire disclosures of which applications are incorporated by reference herein.

TECHNICAL FIELD

The present disclosure relates to a filtering panel and a photovoltaic module including the same.

BACKGROUND ART

Building Integrated Photovoltaic (BIPV) may be a system installed on exterior walls, roofs, or the like of buildings and performing not only photovoltaics but also exterior functions of the buildings, and may be one method capable of utilizing photovoltaics in a city.

However, in terms of architectural design, in order to install a general photovoltaic module on an exterior wall of a building as it is, it is difficult to secure aesthetics of a general exterior material due to limitations to a shape of a solar cell in the module, a darkish color thereof, or the like.

In this regard, technologies for imparting a color layer to a front protective glass or controlling reflectivity have been proposed. However, there is a limitation in securing both power generation performance and aesthetics at the same time.

That is, conventionally, since a region of visible rays was adjusted in terms of aesthetics, and regions other than the region of visible rays were not recognized in terms of power generation performance as a separate task, there was a limitation in securing power generation performance.

In addition, even if visible and infrared rays introduced from a light source such as the sun or the like enter a solar cell, there were limitations to entry of a region of visible rays and a region of infrared rays. Accordingly, there were limitations in that, since the rays were concentrated only on a biased region of the solar cell, efficient power generation performance may not have been secured, or visible rays and infrared rays may be transmitted to a region outside a light-receiving surface of the solar cell, to deteriorate power generation performance.

Accordingly, in order to improve the above-described problems or limitations, there is a need for research on a filtering panel and a photovoltaic module including the same.

DISCLOSURE

Technical Problem

An aspect of the present disclosure is to provide a filtering panel capable of securing power generation performance while securing aesthetics by distinguishing a region of visible rays and a region of infrared rays, and a photovoltaic module including the same.

Another aspect of the present disclosure is to provide a filtering panel capable of receiving light unbiased according to distribution of a light-receiving surface of a solar cell, or receiving and concentrating light by the light-receiving surface, to secure efficient power generation performance, even if regions into which visible and infrared rays introduced from a light source such as the sun or the like enter are restricted, and a photovoltaic module including the same.

Technical Solution

According to an aspect of the present disclosure, a filtering panel includes a molding layer portion; a pattern layer portion having an incident surface into which emission light emitted from a light source and visual line light transmitted to an observer enter and a receiving surface opposite to the incident surface, disposed to stack the molding layer portion adjacent to the incident surface, and adjusting an optical path of the emission light and an optical path of the visual line light; and a filtering layer portion formed on a lower incidence surface of the pattern layer portion on which the incident surface of the visual line light entering from a lower region below a reference line, horizontal to a ground, is formed, having reflectivity of visible rays of the visual line light incident from the lower region greater than reflectivity of visible rays of light incident from an upper region above the reference line by specular reflection, and transmitting infrared rays of the visual line light.

In this case, the filtering layer portion may be formed of a cyanine dye including at least one metal ion selected from magnesium (Mg), nickel (Ni), copper (Cu), cobalt (Co), zinc (Zn), chromium (Cr), platinum (Pt), palladium (Pd), and iron (Fe), transmitting the infrared rays and performing specular reflection on an entirety of the visible rays or only a specific wavelength of visible rays.

In addition, the filtering layer portion may be formed of a resin including a reflective ball, which is a ferromagnetic material performing specular reflection on the visible rays, and formed by applying electromagnetic force to the resin coated in a molten state on the lower incidence surface, to be cured in a state disposed on an outer surface in which the reflective ball faces the molding layer portion.

In this case, the pattern layer portion may include at least one of polyethylene (PE), polyethylene terephthalate (PET), polyimide (PI), polyolefin (PO), polyether ether ketone (PEEK), triacetylcellulose (TAC), poly methyl methacrylate (PMMA), or polyvinyl alcohol (PVA).

In addition, the pattern layer portion may include an upper incidence surface contacting the lower incidence surface inclined toward the lower region based on the reference line and formed in a planar shape, and facing the upper region based on the reference line.

According to an aspect of the present disclosure, a photovoltaic module includes the filtering panel; and a solar cell having one surface disposed on the receiving surface, and receiving the emission light through a light-receiving surface to generate electric power.

In addition, the pattern layer portion may be formed of a material having a lower refractive index than the molding layer portion, and a convex portion protruding convexly with respect to the upper region is formed on the upper incidence surface and diffuses light transferred to the light-receiving surface having a larger area than the upper incidence surface.

Further, the pattern layer portion may be formed of a material having a higher refractive index than the molding layer portion, and a convex portion protruding convexly with respect to the upper region is formed on the upper incidence surface and concentrates light transmitted to the light-receiving surface having a smaller area than the upper incidence surface.

In this case, the convex portion may be provided as a plurality of the convex portions in the upper incidence surface.

In addition, the pattern layer portion may be formed of a material having a higher refractive index than the molding layer portion, and a concave portion recessing concavely with respect to the upper region is formed on the upper incidence surface and diffuses light transferred to the light-receiving surface having a larger area than the upper incidence surface.

Further, the pattern layer portion may be formed of a material having a lower refractive index than the molding layer portion, and a concave portion recessing concavely with respect to the upper region is formed on the upper incidence surface and concentrates light transmitted to the light-receiving surface having a smaller area than the upper incidence surface.

In this case, the concave portion may be provided as a plurality of the concave portions in the upper incidence surface.

Advantageous Effects

A filtering panel of the present disclosure and a photovoltaic module including the same, may have advantages capable of securing power generation performance while securing aesthetics by distinguishing a region of visible rays and a region of infrared rays.

In another aspect, a filtering panel of the present disclosure and a photovoltaic module including the same may have effects capable of receiving light unbiased according to distribution of a light-receiving surface of a solar cell, or receiving and concentrating light by the light-receiving surface, to secure efficient power generation performance, even if regions into which visible and infrared rays introduced from a light source such as the sun or the like enter are restricted.

Various advantages and effects of the present disclosure are not limited to the above-described descriptions, and can be more easily understood in the process of describing specific embodiments of the present disclosure.

DESCRIPTION OF DRAWINGS

FIG. 1 is a cross-sectional view illustrating a photovoltaic module including a filtering panel of the present disclosure.

FIG. 2 is a cross-sectional view illustrating an optical path in a filtering panel of the present disclosure.

FIG. 3 is a cross-sectional view illustrating an embodiment in which a pattern layer portion includes a convex portion in a filtering panel of the present disclosure.

FIG. 4 is a cross-sectional view illustrating states in which light is diffused and concentrated in an embodiment in which a pattern layer portion includes a convex portion in a filtering panel of the present disclosure.

FIG. 5 is a cross-sectional view illustrating an embodiment in which a pattern layer portion includes a concave portion in a filtering panel of the present disclosure.

FIG. 6 is a cross-sectional view illustrating states in which light is diffused and concentrated in an embodiment in which a pattern layer portion includes a concave portion in a filtering panel of the present disclosure.

FIG. 7 is a cross-sectional view illustrating an embodiment in which a filtering layer portion includes a reflective ball in a filtering panel of the present disclosure.

FIG. 8 is a graph illustrating reflectivity and transmittance in a region of visible rays in a filtering panel of the present disclosure and a photovoltaic module including the same.

FIG. 9 is a graph illustrating reflectivity and transmittance in a region of infrared rays in a filtering panel of the present disclosure and a photovoltaic module including the same.

FIG. 10 is a graph illustrating reflectivity and transmittance of an entire region including a region of visible rays and a region of infrared rays in a filtering panel of the present disclosure and a photovoltaic module including the same.

BEST MODE FOR INVENTION

Hereinafter, preferred embodiments of the present disclosure will be described with reference to the accompanying drawings. However, embodiments of the present disclosure may be modified into various other forms, and the scope of the present disclosure is not limited to the embodiments described below. In addition, embodiments of the present disclosure may be provided in order to more completely explain the present disclosure to those with average knowledge in the art. In the drawings, shapes and sizes of elements may be exaggerated for clearer explanation.

In addition, in the present specification, singular expressions may include plural expressions unless clearly defined otherwise in the context, and reference numerals given in the same reference numerals or in a similar manner throughout the specification may refer to the same elements or corresponding elements.

The present disclosure relates to a filtering panel 1 and a photovoltaic module including the same, and may secure power generation performance while securing aesthetics by distinguishing a region of visible rays and a region of infrared rays.

In another aspect, a filtering panel 1 of the present disclosure and a photovoltaic module including the same may receive light unbiased according to distribution of a light-receiving surface 2a of a solar cell 2, or may receive and concentrate light by the light-receiving surface 2a, to secure efficient power generation performance, even if regions into which visible and infrared rays introduced from a light source S such as the sun or the like enter are restricted.

When described in detail with reference to the drawings, FIG. 1 is a cross-sectional view illustrating a photovoltaic module including a filtering panel 1 of the present disclosure, and referring to the drawing, the photovoltaic module of the present disclosure may include the filtering panel 1, and a solar cell 2 having one surface disposed on a receiving surface 22, and receiving emission light through a light-receiving surface 2a to generate electric power.

In this case, the filtering panel 1 may be provided to adjust reflectivity and transmittance of visible and infrared rays, respectively, to secure aesthetics and improve power generation performance, and in other aspects, the filtering panel 1 may receive light unbiased according to distribution of a light-receiving surface 2a of a solar cell 2, or may receive and concentrate light by the light-receiving surface 2a, to secure efficient power generation performance, even if regions into which visible and infrared rays introduced from a light source S enter are restricted. A detailed description of the filtering panel 1 will be described later with reference to FIGS. 2 to 10.

Further, a front layer panel 4 may be provided on a molding layer portion 10 of the filtering panel 1, to protect the filtering panel 1 including the molding layer portion 10.

The front layer panel 4 may, for example, be provided as glass, a polymer film, or the like to block foreign substances from flowing into a filtering layer portion 30, to serve as a protective film.

For example, the front layer panel 4 may be formed of any one of general glass, low iron tempered glass, or a polymer film.

In this case, examples of the polymer film may be at least one of ethylene tetrafluoroethylene (ETFE), polyvinylidene fluoride (PVDF), polydimethylsiloxane (PDMS), polyimide (PI), acrylic, polycarbonate (PC), triacetylcellulose (TAC), or epoxy.

In addition, the solar cell 2 may be configured to convert light energy into electrical energy, and may generate electrical energy for emission light emitted from the light source S that has passed through the filtering panel 1.

In addition, since the specific configuration of the solar cell 2 converting light energy into electrical energy may be the same as that of a general solar cell or photovoltaic cell, a detailed description thereof will be omitted.

In particular, the solar cell 2 may include a light-receiving surface 2a receiving visible and infrared rays transmitted from the light source S, and the light-receiving surface 2a may be entirely formed in the solar cell 2. The light-receiving surface 2a may be provided only on one side of the solar cell according to a structure to be formed.

In addition, the solar cell 2 may be provided with the filtering panel 1 on one surface on which the emission light is incident, and may be provided with a rear layer panel 3 on an opposite surface, to protect the solar cell 2. For example, a rear layer panel 3 disposed on the other surface of the solar cell 2 may be included.

The rear layer panel 3 may be formed of a backsheet such as a fluoropolymer, polyethylene terephthalate (PET), polyethylene (PE), polydimethylsiloxane (PDMS), or tempered glass, for protecting the solar cell 2.

In this case, the solar cell 2 may be coupled to the filtering panel 1 and the rear layer panel 3 by an adhesive layer portion 2b.

The adhesive layer portion 2b may be formed of a material in which an incident rate of the emission light is not reduced, and, for example, may be provided as an organic adhesive material such as ethylene vinyl acetate (EVA), polyolefin elastomer (POE), polyvinylbutyral (PVB), polytetrafluoroethylene (PTFE), polydimethylsiloxane (PDMS), and the like.

FIG. 2 is a cross-sectional view illustrating an optical path in a filtering panel 1 of the present disclosure, and FIG. 8 is a graph illustrating reflectivity and transmittance in a region of visible rays in a filtering panel 1 of the present disclosure and a photovoltaic module including the same.

FIG. 9 is a graph illustrating reflectivity and transmittance in a region of infrared rays in a filtering panel 1 of the present disclosure and a photovoltaic module including the same, FIG. 10 is a graph illustrating reflectivity and transmittance of an entire region including a region of visible rays and a region of infrared rays in a filtering panel 1 of the present disclosure and a photovoltaic module including the same.

Referring to the above drawings, a filtering panel 1 according to an embodiment of the present disclosure may include a molding layer portion 10; a pattern layer portion 20 having an incident surface 21 into which emission light emitted from a light source S and visual line light transmitted to an observer E enter and a receiving surface 22 opposite to the incident surface 21, disposed to stack the molding layer portion 10 adjacent to the incident surface 21, and adjusting an optical path of the emission light and an optical path of the visual line light; and a filtering layer portion 30 formed on a lower incidence surface 21a of the pattern layer portion 20 on which the incident surface 21 of the visual line light entering from a lower region below a reference line CL, horizontal to a ground, is formed, having reflectivity of visible rays of the visual line light incident from the lower region greater than reflectivity of visible rays of the visual line light incident from an upper region above the reference line CL by specular reflection, and transmitting infrared rays of the visual line light.

As described above, the filtering panel 1 of the present disclosure may be provided to adjust reflectivity and transmittance of visible and infrared rays, respectively, to secure aesthetics and improve power generation performance.

For example, the filtering layer portion 30 in which the infrared rays of the visual line light not recognized by the observer E pass entirely through the filtering layer portion 30 and reflectivity of each of the visible rays of the visual line light recognized by the observer E is adjusted by using a difference in entry angle, may be provided.

With respect to emission light emitted from the light source S, directly related to power generation efficiency, the filtering panel may be configured to receive both visible and infrared rays through the pattern layer portion 20. In addition, emission light introduced into the pattern layer portion 20 may be reflected toward a solar cell 2 by the filtering layer portion 30, according to a pattern shape of the pattern layer portion 20.

The molding layer portion 10 may be formed on the incident surface 21 of the pattern layer portion 20, and the filtering layer portion 30 may be formed between the molding layer portion 10 and the pattern layer portion 20. The molding layer portion 10 may induce a change in optical path of the emission light and the visual line light to be introduced, due to a difference in refractive index between the molding layer portion 10 and the pattern layer portion 20.

For example, when a refractive index of the molding layer portion 10 is greater than a refractive index of the pattern layer portion 20, an angle of refraction of refracted light may be induced to be larger than an angle of incidence of incident light based on a normal line of a boundary surface according to Snell's law, on the boundary surface, and when the refractive index of the molding layer portion 10 is lower than the refractive index of the pattern layer portion 20, the angle of refraction of the refracted light may be induced to be smaller than the angle of incidence of the incident light, on the boundary surface.

The pattern layer portion 20 may serve to adjust the optical paths of the emission light and the visual line light. In this case, since the visible rays of the visual line light may be almost reflected by the filtering layer portion 30, most of the visual line light of which optical path is changed by the pattern layer portion 20 may be the infrared rays of the visual line light.

The pattern layer portion 20 may form optical paths through which the emission light and visual line light, to be introduced, are transmitted to a light-receiving surface 2a of the solar cell 2. Therefore, power generation performance by the solar cell 2 may be improved.

For example, the pattern layer portion 20 may form an obtuse angle between an initial entry direction and an emission direction of visible rays of the emission light, and may pass the visible rays in a direction facing the receiving surface 22.

In order to transmit light, the pattern layer portion 20 may be formed of, for example, the following material.

For example, the pattern layer portion 20 of the filtering panel 1 according to an embodiment of the present disclosure may include at least one of polyethylene (PE), polyethylene terephthalate (PET), polyimide (PI), polyolefin (PO), polyether ether ketone (PEEK), triacetylcellulose (TAC), poly methyl methacrylate (PMMA), or polyvinyl alcohol (PVA).

In addition, the pattern layer portion 20 of the filtering panel 1 according to an embodiment of the present disclosure may include an upper incidence surface 21b contacting the lower incidence surface 21a inclined toward the lower region based on the reference line CL and formed in a planar shape, and facing the upper region based on the reference line CL.

For example, the incidence surface 21 of the pattern layer portion 20 may be configured to include the lower incidence surface 21a through which the visual line light is mainly introduced, and the upper incidence surface 21b through which the emission light is mainly introduced.

In this case, when the filtering panel 1 is installed on a wall of a building, the lower incidence surface 21a may be inclined in a downward direction, based on the reference line CL, and the upper incidence surface 21b may be inclined in an upward direction, based on the reference line CL.

In this case, the filtering layer portion 30 may be formed on the lower incidence surface 21a, to reflect visible rays of the visual line light and transmit infrared rays of the visual line light. Therefore, when the observer E on the ground observes, observation of the solar cell 2 or the like over the filtering layer portion 30 may be blocked, but infrared rays may be transmitted to secure power generation performance.

In addition, visible and infrared rays of the emission light may be incident on the upper incident surface 21b to secure power generation performance by the solar cell 2.

In addition, it may also be configured that a convex portion 23 or a concave portion 24 is formed on the upper incidence surface 21b to perform a dispersion or concentration function of light according to distribution of the light-receiving surface 2a of the solar cell 2 to receive light. A detailed description thereof will be described later with reference to FIGS. 3 to 7.

The filtering layer portion 30 may be formed on the lower incidence surface 21a to reflect the visible rays of the visual line light and transmit the infrared rays of the visual line light, to secure aesthetics and power generation performance.

For example, the filtering layer portion 30 may be configured to adjust reflectivity and transmittance of the visible rays of the visual line light, transmitted to the observer E, and pass the infrared rays of the visual line light through an entire region, at the same time.

To this end, the filtering layer portion 30 may be configured to have relatively low transmittance and relatively high reflectivity of the visual line light forming an optical path in the lower region below the reference line CL, horizontal to the ground.

In addition, even with respect to the emission light incident into the pattern layer portion 20, the filtering layer portion 30 may reflect the emission light in a direction facing the receiving surface 22, to be transmitted to the light-receiving surface 2a of the solar cell 2.

In this case, the filtering layer portion 30 may act as specular reflection or regular reflection with respect to the visible rays of the visual line light. The specular reflection may not be reflected by a difference in refractive index between different layers, but may be reflected on a reflective surface of the pattern layer portion 20 by repelling visible rays by a reflective material, and may be completely different from total reflection caused by refraction, in view of premise principle.

In this case, the filtering layer portion 30 of the filtering panel 1 according to an embodiment of the present disclosure may be formed of a cyanine dye including at least one metal ion selected from magnesium (Mg), nickel (Ni), copper (Cu), cobalt (Co), zinc (Zn), chromium (Cr), platinum (Pt), palladium (Pd), and iron (Fe), transmitting the infrared rays and performing specular reflection on an entirety of the visible rays or only a specific wavelength of visible rays.

In addition, the filtering layer portion 30 may be configured to include a reflective ball 31 reflecting the visible rays of the visual line light and transmitting the infrared rays of the visual line light, a detailed description thereof will be described later with reference to FIG. 7.

In this manner, the filtering panel 1 may include the pattern layer portion 20 and the filtering layer portion 30, such that the visual line light forming an optical path in the lower region below the reference line CL, horizontal to the ground, may have relatively low transmittance and relatively high reflectivity, and the emission light forming an optical path in the upper region above the reference line CL, horizontal to the ground, may have relatively high transmittance and relatively low reflectivity.

For example, the filtering panel 1 may be configured to adjust reflectivity and transmittance of the visible rays of the emission light and visual line light, and may be configured to transmit the infrared rays of the emission light and visual line light. For example, the filtering panel 1 may be configured to adjust optical paths of the visible rays of the emission light and visual line light, but may be configured to pass the infrared rays of the emission light and visual line light therethrough.

In other words, as well as an optical path SIR of the infrared rays of the emission light, an optical path EIR of the infrared rays of the visual line light may be configured to form an optical path passing through the inside of the pattern layer portion.

Effects of distinguishing the visible rays and infrared rays of the emission light and visual line light and adjusting transmittance and reflectivity thereof can be seen in FIGS. 8 to 10.

First, FIG. 8 is a graph illustrating reflectivity and transmittance in a region of visible rays. Referring thereto, it can be seen that a lower region, a negative (−) viewing angle, based on a reference line CL having a viewing angle of 0 degree, has relatively high reflectivity and relatively low transmittance of visible rays, and an upper region, a positive (+) viewing angle, has relatively low reflectivity and relatively high transmittance of visible rays.

FIG. 9 is a graph illustrating reflectivity and transmittance in a region of infrared rays. Referring thereto, it can be seen that a lower region, a negative (−) viewing angle, and an upper region, a positive (+) viewing angle, based on a reference line CL having a viewing angle of 0 degree, have relatively low reflectivity and relatively high transmittance of infrared rays.

In addition, a graph illustrated in FIG. 10 may be referred to for reflectivity and transmittance covering both a region of visible rays and a region of infrared rays.

In order to accomplish the above, a filtering panel 1 may be prepared by coating a filtering layer portion 30 on a pattern layer portion 20, and forming a molding layer portion 10 thereon, or may be prepared by forming a pattern layer portion 20, a filtering layer portion 30, and a molding layer portion by 3D inkjet printing. Alternatively, an infrared transmission film may be cut and attached only to a lower incidence surface 21a of a pattern layer portion 20 to form a filtering layer portion 30, and a molding layer portion 10 may be formed thereon.

FIG. 3 is a cross-sectional view illustrating an embodiment in which a pattern layer portion 20 includes a convex portion 23 in a filtering panel 1 of the present disclosure, and FIG. 4 is a cross-sectional view illustrating states in which light is diffused and concentrated in an embodiment in which a pattern layer portion 20 includes a convex portion 23 in a filtering panel 1 of the present disclosure.

Referring to the drawings, a pattern layer portion 20 of a photovoltaic module according to an embodiment of the present disclosure may be formed of a material having a lower refractive index than a molding layer portion 10, and a convex portion 23 protruding convexly with respect to the upper region may be formed on the upper incidence surface 21b and may diffuse light transferred to the light-receiving surface 2a having a larger area than the upper incidence surface 21b.

For example, when the light-receiving surface 2a of the solar cell 2 to which the light is transmitted is widely distributed, the convex portion 23 may be provided in the pattern layer portion such that emission light incident through the upper incidence surface 21b is dispersed with being unbiased to one side of the light-receiving surface 2a.

In this case, formation of the convex portion 23 on the upper incidence surface 21b for dispersion of the emission light may be a case that the pattern layer portion 20 is formed of a material having a lower refractive index than the molding layer portion 10. For example, since a refractive index of the pattern layer portion 20 is lower than a refractive index of the molding layer portion 10, an angle of refraction on a boundary surface may increase according to Snell's law to induce an optical path to be dispersed on a surface of the convex portion 23.

Therefore, the emission light may be induced to an entire region of the light-receiving surface 2a to improve power generation performance.

In addition, since light may be dispersed from the incident surface 21 on which the emission light is incident on the pattern layer portion 20, there may be advantages that light dispersion may be induced in a wider range, and the emission light may be also uniformly mixed with the infrared rays of the visual line light introduced through the lower incident surface 21a, to be transmitted to the light-receiving surface 2a, such that power generation performance may be further improved.

In addition, since the convex portion 23 having functions of dispersing light and forming the pattern layer portion 20 is formed, there is no need to form a separate layer for dispersion. Therefore, a thickness of the filtering panel 1 may be reduced, and a manufacturing process may be simplified.

In addition, a pattern layer portion 20 of a photovoltaic module according to an embodiment of the present disclosure may be formed of a material having a higher refractive index than a molding layer portion 10, and a convex portion 23 protruding convexly with respect to the upper region may be formed on the upper incidence surface 21b and may concentrate light transferred to the light-receiving surface 2a having a smaller area than the upper incidence surface 21b.

For example, when the light-receiving surface 2a of the solar cell 2 to which the light is transmitted is narrowly distributed, the convex portion 23 may be provided in the pattern layer portion 20 such that emission light incident through the upper incidence surface 21b is concentrated without being transmitted to a region other than the light-receiving surface 2a.

In this case, formation of the convex portion 23 on the upper incidence surface 21b for concentration of the emission light may be a case that the pattern layer portion 20 is formed of a material having a higher refractive index than the molding layer portion 10. For example, since a refractive index of the pattern layer portion 20 is greater than a refractive index of the molding layer portion 10, an angle of refraction on a boundary surface may decrease according to Snell's law to induce an optical path to be concentrated on a surface of the convex portion 23.

Therefore, the emission light may be induced to be concentrated on a region in which the light-receiving surface 2a is formed, to improve power generation performance.

In this case, the convex portions 23 of a photovoltaic module according to an embodiment of the present disclosure may be provided as a plurality of the convex portions in the upper incidence surface 21b.

When the plurality of the convex portions 23 are formed as described above, the convex portions may increase roughness in the upper incidence surface 21b while performing the function of dispersing or concentrating the emission light. Therefore, there may be also an advantage of increasing bonding force between the molding layer portion 10 and the pattern layer portion 20, when being formed.

FIG. 5 is a cross-sectional view illustrating an embodiment in which a pattern layer portion 20 includes a concave portion 24 in a filtering panel 1 of the present disclosure, and FIG. 6 is a cross-sectional view illustrating states in which light is diffused and concentrated in an embodiment in which a pattern layer portion 20 includes a concave portion 24 in a filtering panel 1 of the present disclosure.

Referring to the drawings, a pattern layer portion 20 of a photovoltaic module according to an embodiment of the present disclosure may be formed of a material having a higher refractive index than a molding layer portion 10, and a concave portion 24 recessing concavely with respect to the upper region may be formed on the upper incidence surface 21b and may diffuse light transferred to the light-receiving surface 2a having a larger area than the upper incidence surface 21b.

For example, when the light-receiving surface 2a of the solar cell 2 to which the light is transmitted is widely distributed, the concave portion 24 may be provided in the pattern layer portion 20 such that emission light incident through the upper incidence surface 21b is dispersed with being unbiased to one side of the light-receiving surface 2a.

In this case, formation of the concave portion 24 on the upper incidence surface 21b for dispersion of the emission light may be a case that the pattern layer portion 20 is formed of a material having a higher refractive index than the molding layer portion 10. For example, since a refractive index of the pattern layer portion 20 is higher than a refractive index of the molding layer portion 10, an angle of refraction on a boundary surface may decrease according to Snell's law to induce an optical path to be dispersed on a surface of the concave portion 24.

Therefore, the emission light may be induced to an entire region of the light-receiving surface 2a to improve power generation performance.

In addition, since light may be dispersed from the incident surface 21 on which the emission light is incident on the pattern layer portion 20, there may be advantages that light dispersion may be induced in a wider range, and the emission light may be also uniformly mixed with the infrared rays of the visual line light introduced through the lower incident surface 21a, to be transmitted to the light-receiving surface 2a, such that power generation performance may be further improved.

In addition, since the concave portion 24 having functions of dispersing light and forming the pattern layer portion 20 is formed, there is no need to form a separate layer for dispersion. Therefore, a thickness of the filtering panel 1 may be reduced, and a manufacturing process may be simplified.

In addition, a pattern layer portion 20 of a photovoltaic module according to an embodiment of the present disclosure may be formed of a material having a lower refractive index than a molding layer portion 10, and a concave portion 24 recessing concavely with respect to the upper region may be formed on the upper incidence surface 21b and may concentrate light transferred to the light-receiving surface 2a having a smaller area than the upper incidence surface 21b.

For example, when the light-receiving surface 2a of the solar cell 2 to which the light is transmitted is narrowly distributed, the concave portion 24 may be provided in the pattern layer portion 20 such that emission light incident through the upper incidence surface 21b is concentrated without being transmitted to a region other than the light-receiving surface 2a.

In this case, formation of the concave portion 24 on the upper incidence surface 21b for concentration of the emission light may be a case that the pattern layer portion 20 is formed of a material having a lower refractive index than the molding layer portion 10. For example, since a refractive index of the pattern layer portion 20 is lower than a refractive index of the molding layer portion 10, an angle of refraction on a boundary surface may decrease according to Snell's law to induce an optical path to be concentrated on a surface of the concave portion 24.

Therefore, the emission light may be induced to be concentrated on a region in which the light-receiving surface 2a is formed, to improve power generation performance.

In this case, the concave portion 24 of a photovoltaic module according to an embodiment of the present disclosure may be provided as a plurality of the concave portions in the upper incidence surface 21b.

When the plurality of the concave portions 24 are formed as described above, the concave portions may increase roughness in the upper incidence surface 21b while performing the function of dispersing or concentrating the emission light. Therefore, there may be also an advantage of increasing bonding force between the molding layer portion 10 and the pattern layer portion 20, when being formed.

FIG. 7 is a cross-sectional view illustrating an embodiment in which a filtering layer portion 30 includes a reflective ball 31 in a filtering panel 1 of the present disclosure. Referring to the drawing, a filtering layer portion 30 of a filtering panel 1 according to an embodiment of the present disclosure may be formed of a resin including a reflective ball 31, which may be a ferromagnetic material performing specular reflection on the visible rays, and may be formed by applying electromagnetic force to the resin coated in a molten state on the lower incidence surface 21a, to be cured in a state disposed on an outer surface 33 in which the reflective ball 31 faces the molding layer portion 10.

For example, the filtering layer portion 30 may be configured to perform specular reflection on the visible rays of the visual line light and transmit the infrared rays of the visual line light, and include the reflective ball 31. In order to improve reflectivity of specular reflection on the visible rays of the visual line light by the reflective ball 31, the filtering layer portion 30 may be prepared as described above.

For example, in the filtering layer portion 30 formed to have a filter resin layer 32, which may be a resin including reflective balls 31, when the reflective balls 31 are not aligned by electromagnetic force, reflectivity of the reflective balls 31 with respect to the visible rays of the visual line light may be relatively low. Therefore, the filtering layer portion 30 may be prepared by forming reflective balls 31 of a ferromagnetic material, applying electromagnetic force to the filter resin layer 32 in a molten state, to be cured in a state in which the reflective balls 31 are aligned on the outer surface 33 of the filter resin layer 32.

In this manner, the filtering layer portion 30 may be provided to arrange the reflective balls 31 of a ferromagnetic material to be aligned on the outer surface 33, to improve reflectivity of the visible rays of the visual line light.

While example embodiments have been illustrated and described above, it will be apparent to those skilled in the art that modifications and variations could be made without departing from the scope of the present disclosure as defined by the appended claims.

The invention claimed is:

1. A filtering panel comprising:
a molding layer portion;
a pattern layer portion having an incident surface into which emission light emitted from a light source and visual line light transmitted to an observer enter and a receiving surface opposite to the incident surface, the incident surface having a lower incidence surface inclined toward a lower region based on a reference line horizontal to a ground and an upper incidence surface inclined toward the lower region based on the reference line, and
a filtering layer portion disposed on the lower incidence surface of the pattern layer portion on which the incident surface of the visual line light entering from the lower region below the reference line, horizontal to the ground, is disposed, having reflectivity of visible rays of the visual line light incident from the lower region greater than reflectivity of visible rays of light incident from an upper region above the reference line by specular reflection, and transmitting infrared rays of the visual line light,
wherein the filtering layer portion is formed of a resin including a reflective ball, which is a ferromagnetic material performing specular reflection on the visible rays, and formed by applying electromagnetic force to the resin coated in a molten state on the lower incidence surface, to be cured in a state disposed on an outer surface in which the reflective ball faces the molding layer portion.

2. The filtering panel of claim 1, wherein the filtering layer portion is formed of a cyanine dye including at least one metal ion selected from magnesium (Mg), nickel (Ni), copper (Cu), cobalt (Co), zinc (Zn), chromium (Cr), platinum (Pt), palladium (Pd), and iron (Fe), transmitting the infrared rays and performing specular reflection on an entirety of the visible rays or only a specific wavelength of visible rays.

3. The filtering panel of claim 1, wherein the pattern layer portion comprises at least one of polyethylene (PE), polyethylene terephthalate (PET), polyimide (PI), polyolefin (PO), polyether ether ketone (PEEK), triacetylcellulose (TAC), poly methyl methacrylate (PMMA), or polyvinyl alcohol (PVA).

4. The filtering panel of claim 1, wherein the incident surface comprises:
the lower incidence surface inclined toward the lower region based on the reference line, and formed in a planar shape; and
the upper incidence surface contacting the lower incidence surface, and facing the upper region based on the reference line.

5. A photovoltaic module comprising:
the filtering panel of claim 4; and
a solar cell having one surface disposed on the receiving surface, and receiving the emission light through a light-receiving surface to generate electric power.

6. The photovoltaic module of claim 5, wherein the pattern layer portion is formed of a material having a lower refractive index than the molding layer portion, and a convex portion protruding convexly with respect to the upper region is disposed on the upper incidence surface and diffuses light transferred to the light-receiving surface having a larger area than the upper incidence surface.

7. The photovoltaic module of claim 5, wherein the pattern layer portion is formed of a material having a higher refractive index than the molding layer portion, and a convex portion protruding convexly with respect to the upper region is disposed on the upper incidence surface and concentrates light transmitted to the light-receiving surface having a smaller area than the upper incidence surface.

8. The photovoltaic module of claim 5, wherein the pattern layer portion is formed of a material having a higher refractive index than the molding layer portion, and a concave portion recessing concavely with respect to the upper region is disposed on the upper incidence surface and diffuses light transferred to the light-receiving surface having a larger area than the upper incidence surface.

9. The photovoltaic module of claim 5, wherein the pattern layer portion is formed of a material having a lower refractive index than the molding layer portion, and a concave portion recessing concavely with respect to the upper region is disposed on the upper incidence surface and concentrates light transmitted to the light-receiving surface having a smaller area than the upper incidence surface.

* * * * *